(12) United States Patent
Humblet et al.

(10) Patent No.: US 8,806,306 B2
(45) Date of Patent: Aug. 12, 2014

(54) GENERATION OF SOFT BIT METRICS FOR DIFFERENTIALLY ENCODED QUADRATURE PHASE SHIFT KEYING (QPSK)

(75) Inventors: Pierre Humblet, Cambridge, MA (US); Mehmet Aydinlik, Maynard, MA (US)

(73) Assignee: Acacia Communications Inc., Maynard, MA (US)

( * ) Notice: Subject to any disclaimer, the term of this patent is extended or adjusted under 35 U.S.C. 154(b) by 130 days.

(21) Appl. No.: 13/413,316

(22) Filed: Mar. 6, 2012

(65) Prior Publication Data

US 2012/0233526 A1 Sep. 13, 2012

Related U.S. Application Data

(60) Provisional application No. 61/449,803, filed on Mar. 7, 2011.

(51) Int. Cl.
| | |
|---|---|
| *H03M 13/45* | (2006.01) |
| *H04L 25/06* | (2006.01) |
| *H04L 27/233* | (2006.01) |
| *H03M 13/53* | (2006.01) |
| *H03M 13/29* | (2006.01) |

(52) U.S. Cl.
CPC ......... *H04L 25/067* (2013.01); *H03M 13/2957* (2013.01); *H03M 13/45* (2013.01); *H04L 27/2331* (2013.01)
USPC .......................................... 714/780; 714/786

(58) Field of Classification Search
CPC . H04L 25/067; H04L 27/2331; H04L 1/0045; H04L 1/0059; H04L 1/0057; H03M 13/2957; H03M 13/45; H03M 13/29
See application file for complete search history.

(56) References Cited

U.S. PATENT DOCUMENTS

| | | | | |
|---|---|---|---|---|
| 5,396,518 | A * | 3/1995 | How | 375/265 |
| 7,085,987 | B2 * | 8/2006 | Hewitt et al. | 714/755 |
| 8,102,938 | B2 * | 1/2012 | Ashbrook et al. | 375/295 |
| 2005/0157822 | A1 * | 7/2005 | Khandekar et al. | 375/340 |
| 2007/0217536 | A1 * | 9/2007 | Choi | 375/262 |
| 2009/0224054 | A1 * | 9/2009 | Wei et al. | 235/470 |

* cited by examiner

*Primary Examiner* — Ajay Bhatia
*Assistant Examiner* — Dipakkumar Gandhi
(74) *Attorney, Agent, or Firm* — Jeffery J. Brosemer

(57) ABSTRACT

A computer implemented method for generating soft bit metric information of telecommunications systems employing differential encoding of data.

8 Claims, 4 Drawing Sheets

GENERATION OF SOFT BIT METRICS FOR DIFFERENTIALLY ENCODED QUADRATURE PHASE SHIFT KEYING (QPSK)

CROSS REFERENCE TO RELATED APPLICATION

This application claims the benefit of U.S. Provisional Patent Application Ser. No. 61/449,803 filed Mar. 7, 2011 which is incorporated by reference in its entirety as if set forth at length herein.

TECHNICAL FIELD

This disclosure relates generally to the field of telecommunications and in particular to a method for the generation of soft information from differentially encoded QPSK (DE-QPSK) as well as higher order schemes.

BACKGROUND

A number of contemporary communications systems—for example, differentially encoded QPSK, 16 QAM, 64 QAM—employ differential encoding to achieve a robustness with respect to phase noise and channel impairments. As is known, such systems require a differential decoding operation at a receiver to recover transmitted information. Oftentimes, to achieve superior performance, a soft decision encoding/decoding (SDFEC) is also employed. A SDFEC decoder requires soft bit metric information for the bits at the differential decoder.

Accordingly, methods and apparatus that provide for the efficient generation of soft bit metric information from DE-QPSK symbols would represent a welcome addition to the art.

SUMMARY

An advance in the art is made according to an aspect of the present disclosure directed to methods and apparatus for the efficient generation of soft bit metric information from DE-QPSK symbols.

BRIEF DESCRIPTION OF THE DRAWING

A more complete understanding of the present disclosure may be realized by reference to the accompanying drawings in which.

DETAILED DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently-known equivalents as well as equivalents developed in the future, i.e., any elements developed that perform the same function, regardless of structure.

Thus, for example, it will be appreciated by those skilled in the art that the diagrams herein represent conceptual views of illustrative structures embodying the principles of the invention.

In addition, it will be appreciated by those skilled in art that any flow charts, flow diagrams, state transition diagrams, pseudocode, and the like represent various processes which may be substantially represented in computer readable medium and so executed by a computer or processor, whether or not such computer or processor is explicitly shown.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein. Finally, and unless otherwise explicitly specified herein, the drawings are not drawn to scale.

Thus, for example, it will be appreciated by those skilled in the art that the diagrams herein represent conceptual views of illustrative structures embodying the principles of the disclosure.

Figure 1:
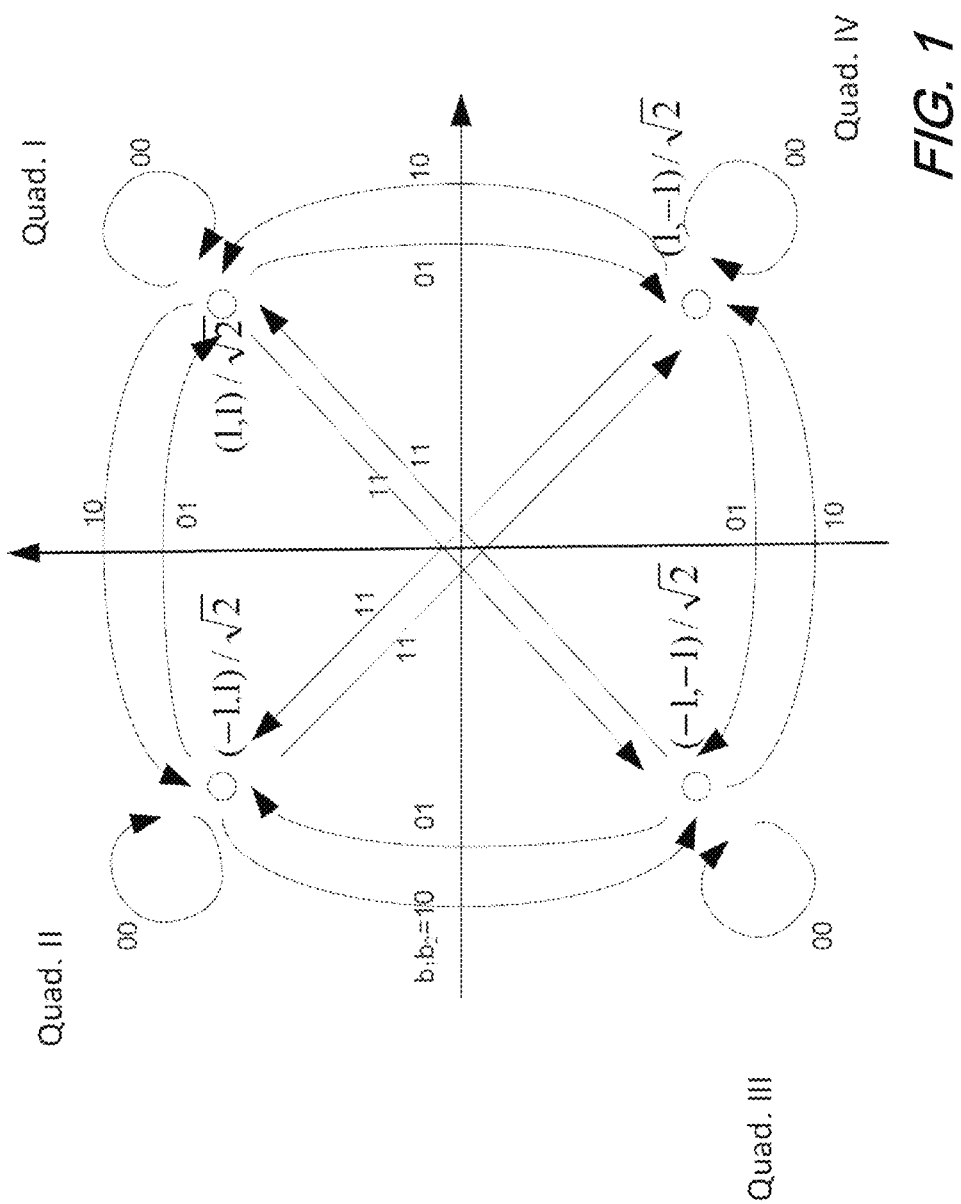
FIG. 1 shows an exemplary state transition diagram for differential endocing according to an aspect of the present disclosure.

By way of some additional background, we begin by noting that FIG. 1 depicts a state diagram showing an overview of a general differential encoding method. As may be observed from that FIG. 1, the small circles labeled $\alpha, \beta, \gamma, \delta$ represent sets of possible differentially encoded output symbols (constellation points). There is one set located in every quadrant of the diagram.

As may be readily appreciated by those skilled in the art and in the simplest case namely, DE-QPSK, there is only one symbol in each set with in-phase and quadrature components $(I,Q)=(\pm 1/\sqrt{2}, \pm 1/\sqrt{2})$ as indicated in FIG. 1.

For simplification, we first focus on a simple case and generalize it later. More particularly, input bits denoted by $(b_1, b_2)$ determine the transition between output symbols. As depicted in FIG. 1, a differential encoder applies the following rules to a transmitted two dimensional constellation symbols $(I_i, Q_i)$:

Initialization: Set $(I_{-1}, Q_{-1})=(-1/\sqrt{2},-1/\sqrt{2})$

For time i=0, 1, 2, . . .

If the input bits $(b_1, b_2)$ to the differential decoder at time i are

00: no rotation is applied, $(I_i, Q_i)=(I_{i-1},Q_{i-1})$;

01: 90-degree clockwise rotation is applied, $(I_i,Q_i)=(Q_{i-1},-I_{i-1})$;

10: 90-degree counter-clockwise rotation is applied, $(I_i,Q_i)=(-Q_{i-1},I_{i-1})$;

11: 180-degree rotation is applied, $(I_i,Q_i)=(-I_{i-1},-Q_{i-1})$

In a typical, real-world environment, the symbols are transmitted on a channel and corrupted by noise. As those skilled in the art will readily appreciate, a typical, contemporary digital receiver includes a number of functional blocks. In particular, at low and radio frequencies a front end may include filters, amplifiers and mixers, followed by one or more Analog to Digital (A/D) converters. For those implementations involving optical frequencies employing coherent detection, a received optical signal is mixed with a local laser light to separate in-phase and quadrature components, each of which is converted into electrical signals by pairs of photodiodes followed by transinductance amplifiers—the output of which is provided to A/D converters.

Sampled signals are then applied to functional blocks that perform frequency, phase and timing acquisition as well as tracking and equalization. As those skilled in the art will know, one reason for using differential encoding—even though a receiver tracks the phase—is that the receiver may suffer occasional "phase slips" that may be disastrous in absence of differential encoding. Systems in which receivers do not track the phase can also exploit differential encoding but they are not relevant for our purposes herein.

For our discussion of soft metrics, we assume that—eventually—a receiver produces received symbols $C_{t-1}$ and $C_t$ which represent successive received symbols that are "close" to the original transmitted symbol. We will consider t=2, so both $C_1$ and $C_2$ are relevant for our purposes.

As may be appreciated, one could simply process these to obtain "hard decisions" on the bits $b_1$ and $b_2$, for example by observing transitions between quadrants to which the received symbols belong. Those bits would then be passed to an error correction decoder.

However a class of error correction decoder, known as Soft Decision decoders, can use reliability information known as "soft metric" as an input to provide improved performance, instead of just using only the "hard decisions".

As those skilled in the art readily appreciate, soft metrics represent the reliability of each bit, given the observations $C_1$ and $C_2$. Additionally, soft metrics may take many equivalent forms. For our purposes herein, we focus on one, namely the logarithmic-likelihood ratio (LLR).

The general equation for LLR of $b_i$, i=1 or 2, may be represented as:

$$llr(b_i) = \log\left(\frac{P(b_i = 1 \mid C_1,C_2)}{P(b_i = 0 \mid C_1,C_2)}\right) \quad (1)$$

For i=1, equation 1 may be expressed as:

$$llr(b_1) = \log\left(\frac{P(\alpha,\beta \mid C_1,C_2) + P(\alpha,\gamma \mid C_1,C_2) + P(\beta,\gamma \mid C_1,C_2) + P(\beta,\delta \mid C_1,C_2)}{P(\alpha,\delta \mid C_1,C_2) + P(\alpha,\alpha \mid C_1,C_2) + P(\beta,\alpha \mid C_1,C_2) + P(\beta,\beta \mid C_1,C_2)}\right.$$
$$\left. \cdots \frac{P(\gamma,\delta \mid C_1,C_2) + P(\gamma,\alpha \mid C_1,C_2) + P(\delta,\alpha \mid C_1,C_2) + P(\delta,\beta \mid C_1,C_2)}{P(\gamma,\beta \mid C_1,C_2) + P(\gamma,\gamma \mid C_1,C_2) + P(\delta,\gamma \mid C_1,C_2) + P(\delta,\delta \mid C_1,C_2)}\right) \quad (2)$$

Here, $P(\mu,\nu \mid C_1\ C_2)$ represents the a posteriori probability of transitioning from transmitted symbol in set $\mu$ to a transmitted symbol in set $\nu$ given channel outputs $C_1$ and $C_2$. Note that transitions in the numerator of equation 2 are associated with $b_1=1$ while the transitions on the denominator of equation 2 are associated with $b_1=0$. As those skilled in the art will readily appreciate, $llr(b_2)$ can also be written in a similar way.

We assume that the combination of the channel followed by the receiver front end described above only contributes Additive White Gaussian Noise to the transmitted symbols, where the noise is complex symmetric with 0 mean and variance $\sigma^2$, and that the transmitted symbols are independent and equally distributed among the constellation points. It follows then that given $C_1$ and $C_2$, the LLRs for $b_1$ and $b_2$ do not depend on other $C_t$, as already assumed, and furthermore that:

$$P(\mu,\nu \mid C_1\ C_2) = P(\mu \mid C_1) P(\nu \mid C_2) \quad (3)$$

We let $C_1=(x_1,y_1)$ where $x_1$ and $y_1$ denote the in-phase and quadrature components respectively. Similarly $C_2=(x_2, y_2)$. In this case Eq. 2 can be expressed as:

$$llr(b_1) = \log\left\{\frac{e^{\frac{-x_1-y_1+x_2-y_2}{\sigma^2\sqrt{2}}} + e^{\frac{-x_1-y_1+x_2+y_2}{\sigma^2\sqrt{2}}} + e^{\frac{-x_1+y_1-x_2-y_2}{\sigma^2\sqrt{2}}} + e^{\frac{-x_1+y_1+x_2-y_2}{\sigma^2\sqrt{2}}} +}{e^{\frac{-x_1-y_1-x_2-y_2}{\sigma^2\sqrt{2}}} + e^{\frac{-x_1-y_1-x_2+y_2}{\sigma^2\sqrt{2}}} + e^{\frac{-x_1+y_1-x_2-y_2}{\sigma^2\sqrt{2}}} + e^{\frac{-x_1+y_1+x_2+y_2}{\sigma^2\sqrt{2}}} +}\right.$$
$$\left.\frac{e^{\frac{x_1-y_1+x_2+y_2}{\sigma^2\sqrt{2}}} + e^{\frac{x_1-y_1-x_2+y_2}{\sigma^2\sqrt{2}}} + e^{\frac{x_1+y_1-x_2-y_2}{\sigma^2\sqrt{2}}} + e^{\frac{x_1+y_1-x_2+y_2}{\sigma^2\sqrt{2}}}}{e^{\frac{x_1-y_1+x_2-y_2}{\sigma^2\sqrt{2}}} + e^{\frac{x_1-y_1-x_2-y_2}{\sigma^2\sqrt{2}}} + e^{\frac{x_1+y_1+x_2-y_2}{\sigma^2\sqrt{2}}} + e^{\frac{x_1+y_1+x_2+y_2}{\sigma^2\sqrt{2}}}}\right\} \quad (4)$$

Similarly $LLR_{CQi}$ can be written as $$llr(b_2) = \log\left\{\frac{e^{\frac{x_1+y_1-x_2-y_2}{\sigma^2\sqrt{2}}} + e^{\frac{x_1+y_1+x_2-y_2}{\sigma^2\sqrt{2}}} + e^{\frac{-x_1+y_1+x_2-y_2}{\sigma^2\sqrt{2}}} + e^{\frac{-x_1+y_1+x_2+y_2}{\sigma^2\sqrt{2}}} +}{e^{\frac{x_1+y_1+x_2+y_2}{\sigma^2\sqrt{2}}} + e^{\frac{x_1+y_1-x_2+y_2}{\sigma^2\sqrt{2}}} + e^{\frac{-x_1+y_1-x_2+y_2}{\sigma^2\sqrt{2}}} + e^{\frac{-x_1+y_1-x_2-y_2}{\sigma^2\sqrt{2}}} +}\right.$$
$$\left.\frac{e^{\frac{-x_1-y_1+x_2+y_2}{\sigma^2\sqrt{2}}} + e^{\frac{-x_1-y_1-x_2+y_2}{\sigma^2\sqrt{2}}} + e^{\frac{x_1-y_1-x_2+y_2}{\sigma^2\sqrt{2}}} + e^{\frac{x_1-y_1-x_2-y_2}{\sigma^2\sqrt{2}}}}{e^{\frac{-x_1-y_1-x_2-y_2}{\sigma^2\sqrt{2}}} + e^{\frac{-x_1-y_1+x_2-y_2}{\sigma^2\sqrt{2}}} + e^{\frac{x_1-y_1+x_2-y_2}{\sigma^2\sqrt{2}}} + e^{\frac{x_1-y_1+x_2+y_2}{\sigma^2\sqrt{2}}}}\right\} \quad (5)$$

As may be observed, there are 16 terms are involved in Equations (4) and (5), each one of which requires the evaluation of an exponential. Therefore computational complexity for these equations is extremely high. Advantageously, and according to an aspect of the present disclosure, we have developed a simplified method. Our simulations indicate that this simplified method causes insignificant performance degradation compared to using optimal LLRs.

Our simplified method according to an aspect of the present disclosure identifies dominating terms in the numerator and denominator of the llr.

We begin by noting that the 16 terms in Equations (4) and (5) differ only by the signs of the exponents in front of the $x_i$'s and $y_i$'s, with all 16 possible sign combinations represented once. Since the exponential function is an increasing function, it is clear that the overall dominant term will have exponent signs that match the signs of the $x_i$'s and $y_i$'s, so as to maximize the sum.

Notably, this overall dominant term corresponds to what is used in traditional "hard decision" of DE-QPSK. In that method the signs of the coordinates of $C_1$ and $C_2$ are used to determine the quadrant in which these point lie and the decisions is made in favor of the bits $b_1$ and $b_2$ that corresponds to a transition from the quadrant of $C_1$ to the quadrant of $C_2$ as shown in FIG. 1.

Note that depending on the $x_i$'s and $y_i$'s the overall dominant term can appear in the numerators or in the denominators of Equations (4) and (5), depending on the value of the hard decisions (the largest term is in the numerator if the decision is a 1). If the overall dominant term is in the numerator of equation (4) (or (5)), then in order to get an approximate soft metric we need to find the largest term in the denominator of that equation, and conversely if the dominant term appears in the denominator.

As previously noted, for a term to be large the signs in front of the $x_i$'s and $y_i$'s must match the sign of the $x_i$'s and $y_i$'s. And while an exact match is not possible (it only occurs in the overall dominant term), inspection of equations (4) and (5) show that, for each of the 16 possible choices of the dominant term, it is possible to find two terms on the other side of the fraction where in each term the signs match in 3 positions and differ in only 1 position. These terms are good candidates to be the largest. Of these two terms, the largest one is the one where the negative position has the smallest absolute value.

Figure 2:
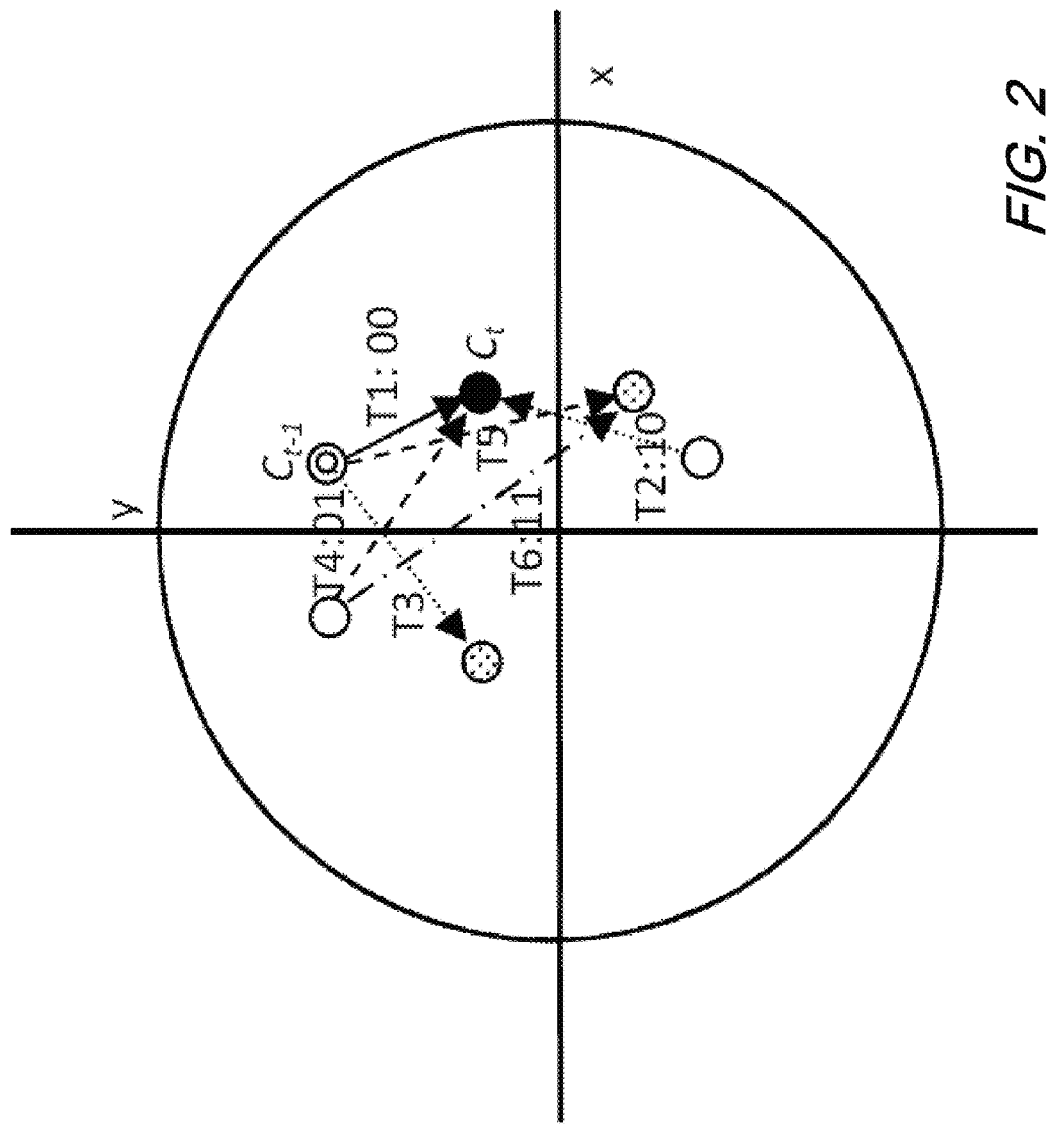
FIG. 2 shows a particular example of a most and second most likely transition according to an aspect of the present disclosure.

We may illustrate this point by the example given in FIG. 2. With reference to that FIG. 2, note that the double small circle represents the received DE-QPSK symbols $C_1$ while the dark circle represents $C_2$. The clear circles are the mirror images of $C_1$ with respect to the axes, while the dotted circles are mirror images of $C_2$. Transitions between those points correspond to terms in equations (4) and (5), as we will see shortly.

We first find the most likely transition. Note that that all $x_i$ and $y_i$ are >0 so channel outputs are in quadrant 1. Therefore the most likely transition is the one denoted by T1 and shown as a solid arrow in FIG. 1. That transition is associated with the term $$e^{\frac{x_1+y_1+x_2+y_2}{\sigma^2/\sqrt{2}}}$$

in equations (4) and (5). Notably, this dominant term happens to be in the denominators and thus corresponds to hard decisions $b_1=0$ and $b_2=0$.

Now we want to find the largest term in the numerators. Let us consider Equation (4) for $b_1$ first. There are two possible transitions for the most dominant term in the numerator (corresponding to $b_1=1$) of Equation (4) where only one coordinate sign is flipped. These transitions are denoted by T2 and T3 (dotted arrows) in FIG. 2.

We can select the most dominant term between T2 and T3 by comparing $y_1$ and $x_2$. In particular, If $x_2<y_1$, the term associated with T3 is the most dominant term in the denominator; and If $x_2>y_1$, the term associated with T2 is the most dominant term in the denominator.

Since $x_2<y_1$ in FIG. 2, therefore T3 will be the most likely transition for denominator.

The term associated with T3 is:

$$e^{\frac{x_1+y_1-x_2+y_2}{\sigma^2/\sqrt{2}}}.$$

Keeping only these terms in Equation 3, $llr(b_1)$ can be approximated as:

$$llr(b_1) \approx \log\left(\frac{e^{\frac{x_1+y_1-x_2+y_2}{\sigma^2/\sqrt{2}}}}{e^{\frac{x_1+y_1+x_2+y_2}{\sigma^2/\sqrt{2}}}}\right) = \frac{-2x_2}{\sigma^2\sqrt{2}}.$$

A similar derivation can be done in the case where $y_1<x_2$ which leads to:

$$llr(b_1) \approx \log\left(\frac{e^{\frac{x_1-y_1+x_2+y_2}{\sigma^2/\sqrt{2}}}}{e^{\frac{x_1+y_1+x_2+y_2}{\sigma^2/\sqrt{2}}}}\right) = \frac{-2y_1}{\sigma^2\sqrt{2}}.$$

So the more general expression is:

$$llr(b_1) \approx \frac{-2\min(y_1, x_2)}{\sigma^2\sqrt{2}} \qquad (6)$$

Similarly in Equation 5, T4 and T5 (represented by dashes arrows in FIG. 2) result in $b_2=1$. To determine which is most likely, positions $x_1$ and $y_2$ have to be compared. The approximation of llr of $b_2$ can be found as $$llr(b_2) \approx \frac{-2\min(x_1, y_2)}{\sigma^2\sqrt{2}} \qquad (7)$$

Note that the likelihood ratio equations (6) and (7) are negative because the approximate denominator is larger than the approximate numerator. This matches the hard decisions, which are both 0 when $C_1$ and $C_2$ are in the same quadrant.

To avoid having to differentiate between cases where the dominant term is in the numerator or denominator, we will consider modifying each llr as follows: we change its sign when the hard decision is 0. Modified llr's always have their dominant term in the numerator. A modified llr will be denoted by "mllr".

In this example, we have assumed that both channel outputs are in quadrant 1. The same logic applies to all the other cases, but the two possible isolated negative positions (such as $y_1$ and $x_2$ for $b_1$ in the example above) will depend on the quadrants in which $C_1$ and $C_2$ lie. It is convenient to generalize the notation and to denote the two possible isolated negative positions for $b_1$ (equation 3) by $p^1_1$ and $p^1_2$, while for $b_2$ (equation 4) we will use $p^2_1$ and $p^2_2$.

By examining all 16 cases one can create the following table giving the $p^k_j$ (k=1 or 2, j=1 or 2) as functions of $C_1$ and $C_2$.

TABLE 1

| Conditions | | $p^1_1$ and $p^1_2$, | $p^2_1$ and $p^2_2$, |
|---|---|---|---|
| $C_1$ and $C_2$ are in adjacent quadrants | $C_1$ is in the 1st or 3rd quadrant | $x_1, x_2$ | $y_1, y_2$ |
| | $C_1$ is in the 2nd or 4th quadrant | $y_1, y_2$ | $x_1, x_2$ |
| $C_1$ and $C_2$ are not in adjacent quadrants | $C_1$ is in the 1st or 3rd quadrant | $y_1, x_2$ | $x_1, y_2$ |
| | $C_1$ is in the 2nd or 4th quadrant | $x_1, y_2$ | $y_1, x_2$ |

With reference to TABLE 1, there it shows that $p^k_1$ (k=1 or 2) can be a coordinate ($x_1$ or $y_1$) of $C_1$ while $p^k_2$ is a coordinate ($x_2$ or $y_2$) of $C_2$. Furthermore the coordinates $p^k_j$ (k=1 or 2, j=1 or 2) are all distinct.

Formally, the dominant term (which is the same for k=1 or 2) can be expressed as:

$$e^{\frac{|p^k_1|+|p^k_2|+|p^{\sim k}_1|+|p^{\sim k}_2|}{\sigma^2 \sqrt{2}}}$$

where ~k denotes 3−k, i.e. ~1=2 and ~2=1, while the selected term on the other side of the fraction for the llr of $b_k$ is:

$$e^{\frac{-\min(|p^k_1|,|p^k_2|)+\max(|p^k_1|,|p^k_2|)+|p^{\sim k}_1|+|p^{\sim k}_2|}{\sigma^2\sqrt{2}}}$$

Keeping only those two terms yields:

$$mllr(b_k) \approx \frac{2\min(|p^k_1|, |p^k_2|)}{\sigma^2\sqrt{2}} \quad (8)$$

So far in our search for the non-dominant largest term we have considered the two terms with exponents that are the sum of three positive numbers and one negative number. A closer examination of equations 3 and 4 reveals that one of these two terms is indeed always larger than all the other terms in the same numerator or denominator, except possibly for one. For $b_k$ that one exceptional term has the form $$e^{\frac{|p^k_1|+|p^k_2|-|p^{\sim k}_1|-|p^{\sim k}_2|}{\sigma^2\sqrt{2}}}.$$

For example in the case considered above where $C_1$ and $C_2$ are in the first quadrant and $p^1_1 = y_1$, $p^1_2 = x_2$, we find in the denominator of equation 3 the term:

$$e^{\frac{-x_1+y_1+x_2-y_2}{\sigma^2\sqrt{2}}}.$$

Note that the signs of $x_2$ and $y_1$ are positive. It is represented by the transition T6 (dash-dot arrow) in FIG. 2.

This special term will be larger than the term found in equation (8) if $$|p^{\sim k}_1|+|p^{\sim k}_2| < \min(|p^k_1|, |p^k_2|) \quad (9)$$

If one keeps only the largest term on each side of the fraction and condition 8 occurs for k=1 or 2, the approximate mllr is given by $$mllr(b_k) \approx \frac{2(|p^{\sim k}_1|+|p^{\sim k}_2|)}{\sigma^2\sqrt{2}} \quad (10)$$

This condition occurs very rarely as it requires that the sum of two absolute values be smaller than the minimum of two others, where all the values are independent and identically distributed. In addition it is easy to see that condition (9) cannot hold at the same time for both k=1 and k=2. We have observed empirically that handling the special case of condition (9) only improves the performance of a soft decision decoder slightly.

Another manner to improve the quality of the approximations is to keep more terms in equations (4) and (5). It is particularly appealing to only include terms that are known to be significant because the negative values in their exponent have small magnitudes, i.e. $\min(|p^k_1|, |p^k_2|)$ for k=1 and 2, or $|p^{\sim}_1|$ and $|p^{\sim}_2|$ if condition (9) holds for k=1 or 2.

The resulting expressions are given below. The logarithms have three terms, but one can optionally keep only the two largest. The correction terms can be implemented by a table lookup.

If condition 8 holds for k=1 or 2 then:

$$mllr(b_k) \approx \frac{2(|p^{\sim k}_1|+|p^{\sim k}_2|)}{\sigma^2/\sqrt{2}} + \log\left(1+e^{\frac{-2|p^{\sim k}_1|}{\sigma^2/\sqrt{2}}}+e^{\frac{-2|p^{\sim k}_2|}{\sigma^2/\sqrt{2}}}\right) \quad (11)$$

$$mllr(b_{\sim k}) \approx \frac{2(\min(|p^{\sim k}_1|, |p^{\sim k}_2|))}{\sigma^2/\sqrt{2}} - \log\left(1+e^{\frac{-2(\max(|p^k_1|,|p^k_2|)-\min(|p^{\sim k}_1|,|p^{\sim k}_2|))}{\sigma^2/\sqrt{2}}}+e^{\frac{-2\max(|p^{\sim k}_1|,|p^{\sim k}_2|)}{\sigma^2/\sqrt{2}}}\right) \quad (12)$$

Note that the correction term in equation (12) is negative and can result in a negative mllr. This simply indicates that the hard decision must be inverted. The traditional hard decision rule may not minimize the bit error probability when the points $C_1$ and/or $C_2$ are very near the edge of a quadrant.

If condition (9) does not hold for any k, and the index j that achieves $\min_j(|p^k_j|)$ is different for k=1 and k=2 and:

$$mllr(b_k) \approx \frac{2\min(|p^k_1|, |p^k_2|)}{\sigma^2/\sqrt{2}} + \log\left(1+e^{\frac{-2\min(|p^{\sim k}_1|,|p^{\sim k}_2|)}{\sigma^2/\sqrt{2}}}+e^{\frac{-2(\min(|p^k_1|,|p^k_2|)+\min(|p^{\sim k}_1|,|p^{\sim k}_2|))}{\sigma^2/\sqrt{2}}}\right) \quad (13)$$

for k=1 or 2.

If none of the above holds, one extra term occurs in the numerator and one in the denominator and they cancel each other exactly. So the simple relationship (9) applies without change as:

$$mllr(b_k) \approx \frac{2(\min(|p_1^k|, |p_2^k|))}{\sigma^2/\sqrt{2}}$$

At this point we may now summarize our method according to an aspect of the present disclosure. More particularly:

At every time t:
1. Consider the signs of the coordinates of $C_{t-1}$ and $C_t$, apply the traditional hard decision rule for $b_1$ and $b_2$ and determine the $p^k_i$ as indicated in Table 1.
2. Compare the magnitudes of $p^k i$ to determine $\min_j(|p^k_j|)$. If desired also check for condition 10.
3. Calculate the mllrs using relationships 8 and 10, using only simple arithmetic
4. If desired, apply correction terms specified by equations 11, 12 and 13, possibly using a table lookup
5. Obtain $llr(b_k)$ from $mllr(b_k)$, changing the sign if the hard decision for $b_k$ determined in step 1 is a 0

With these principles in place, we may now describe an exemplary hardware implementation for the method of the present disclosure. More particularly, for k=1 and 2 let $d_k$ be a Boolean variable that is true (or 1) if and only if $x_k<0$ and let $c_k$ be a Boolean variable that is true if and only if $y_k<0$. As will be readily appreciated by those skilled in the art, these variables are simply the sign bits of $x_k$ and $y_k$ in traditional binary hardware representations. One can see that $C_k$ is in the 1st or 3rd quadrant if $d_k \hat{} e_k$ is false (or 0), where $\hat{}$ denotes the exclusive-or operation.

Using this fact can then change Table 1 to the following form

TABLE 2

| Conditions | | | |
|---|---|---|---|
| $d_1 \hat{} e_1$ | $d_2 \hat{} e_2$ | $p^1_1$ and $p^1_2$ | $p^2_1$ and $p^2_2$ |
| 0 | 1 | $x_1, x_2$ | $y_1, y_2$ |
| 1 | 0 | $y_1, y_2$ | $x_1, x_2$ |
| 0 | 0 | $y_1, x_2$ | $x_1, y_2$ |
| 1 | 1 | $x_1, y_2$ | $y_1, x_2$ |

Figure 3:
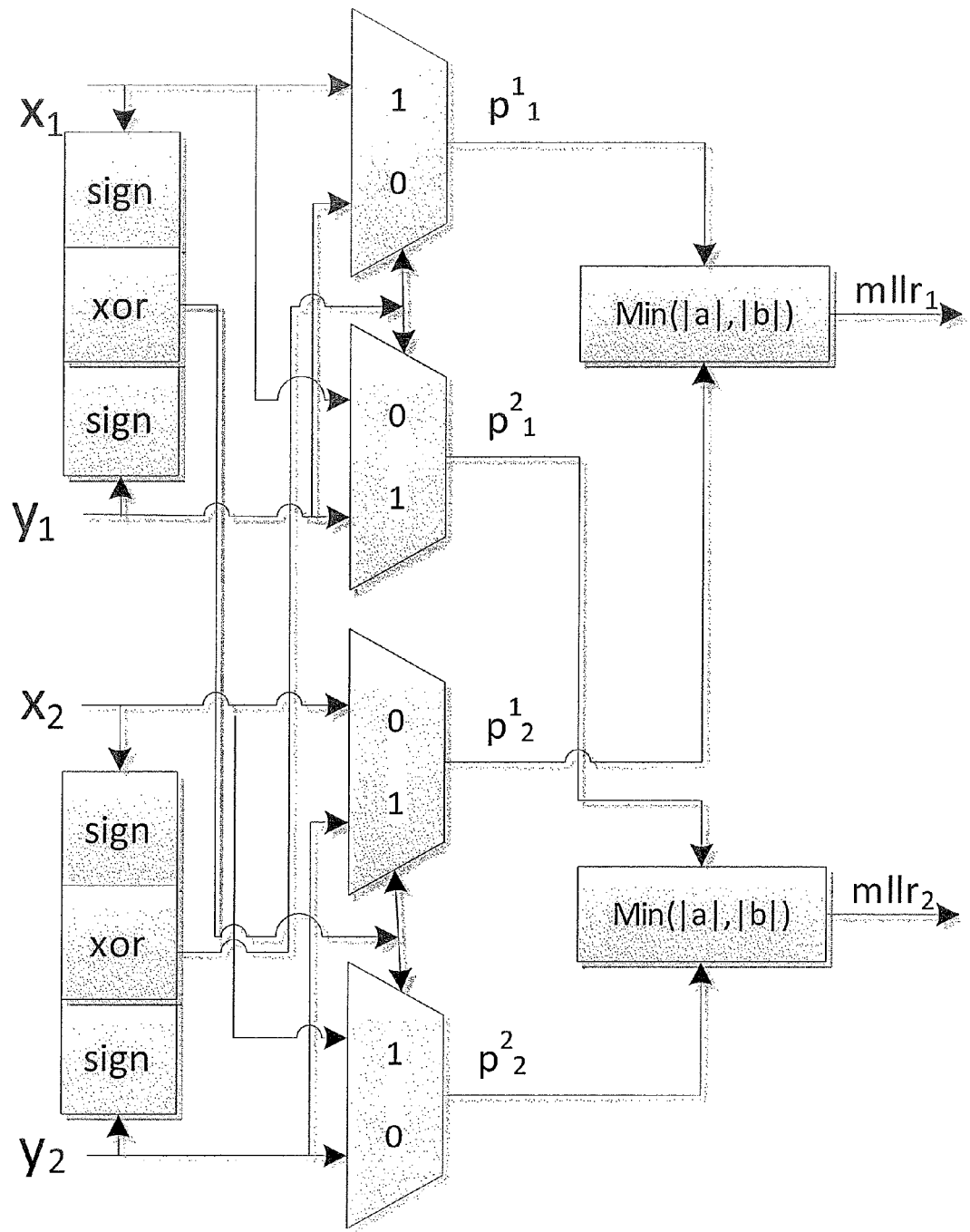
FIG. 3 shows a schematic diagram depicting an exemplary circuit to compute modified logarithmic-likelihood ratio (mLLR) according to an aspect of the present disclosure.

A hardware circuit to evaluate the mllr's is shown in FIG. 3, not including optional correction factors. It assumes that the inputs x and y have already been scaled to take the variance $\sigma^2$ into account. The trapezoidal shaped box represents a selector. It transfers to its output one of its two inputs connected to its long side depending on the value of the control input on the short side.

We now note and as will be readily appreciated that the present disclosure may be extended to higher order situations. In higher order constellations such as 16 QAM or 256 QAM there are several points in each quadrant and more than two input bits to select which constellation point is to be transmitted. However only two bits, says $b_1$ and $b_2$ are used to perform the differential encoding, following the example of DE-QPSK. The remaining bits are used to select a point in a quadrant in a way that is not relevant to this discussion.

Using the same channel and receiver model as for DE-QPSK the factor $P(\alpha|C)$ used in equation XX with observation $C=(x, y)$ is $$f(x, y) = K \Sigma_i \exp(-((\alpha^i_I - x)^2 + (\alpha^i_Q - y)^2)/2\sigma^2));$$

where the sum is over the constellation points $\alpha^i$ in set $\alpha$ (first quadrant) with in-phase and quadrature components $\alpha^i_I$ and $\alpha^i_Q$. K is a normalization factor that is not relevant.

The constellations used with differential encoding have the property that the points in sets $\beta$, $\gamma$ and $\delta$ can be obtained by rotating the points in set $\alpha$ by $\pi/2$, $\pi/2$ and $3\pi/2$ respectively. It follows that:

$$P(\beta|C) = f(y, -x)$$

$$P(\gamma|C) = f(-x, -y);$$

$$P(\gamma|C) = f(-y, x)$$

Equations 3 and 4 can be rewritten as the logarithms of the ratios of sums of 8 products of pairs functions f, with $x_1$ and $y_1$ appearing as arguments in the first factor of the pair while $x_2$ and $y_2$ are arguments of the second factor. Furthermore when the constellation points in a quadrant are located symmetrically around the diagonal $f(x,y)=f(y,x)$ and one can see that $f(x,y) \leq f(|x|,|y|)$. The observations above can significanty simplify the computation of the LLRs. In particular the most significant term can be identified by the signs of the signal components and candidates for the other significant term can be obtained from Tables 1 and 2.

In the most common cases, in particular 16 QAM and 256 QAM, the constellation points are located on a square grid. It then follows that $$f(x,y) = K'(|x|)K'(|y|)\exp(g(x)+g(y)) \text{ where}$$

$$g(x) = \log(\Sigma_i \exp(\alpha^i_I(2x-\alpha^i_I)/2\sigma^2)/\Sigma_i \exp(-(\alpha^i_I)^2/2\sigma^2)).$$

The function $K'( )$ is not relevant as it has the same value in all terms. The function $g(x)$ is odd and increasing and can it be well approximated by table lookup or as a piecewise linear function. It follows that the terms $\exp(\pm x \pm y)$ in Equations 4 and 5 are simply replaced by $\exp(g(\pm x)+g(\pm y))$ or equivalently by $\exp(\pm g(|x|) \pm g(|y|))$. The steps given for DE-QPSK can be extended immediately to the higher order constellations. In particular Equation 9 is replaced by:

$$mllr(b_k) \approx 2g(\min(|p_1^k|, |p_2^k|))$$

while the other approximations can also be obtained essentially by replacing expressions involving $p^k_i$ by the function g evaluated at those expressions, as will be apparent to those familiar with the art.

Figure 4:
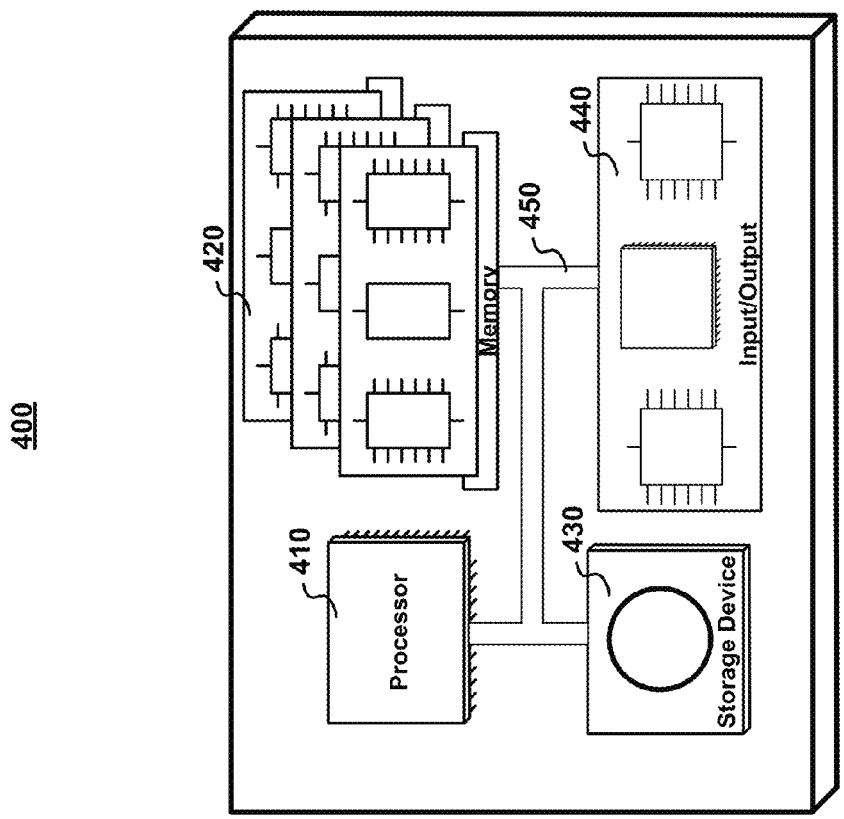
FIG. 4 shows a schematic block diagram of an exemplary computer system on which methods according to the present disclosure may be executed upon.

FIG. 4 shows an illustrative computer system 400 suitable for implementing methods and systems according to an aspect of the present disclosure. The computer system may comprise, for example a computer running any of a number of operating systems. The above-described methods of the present disclosure may be implemented on the computer system 400 as stored program control instructions.

Computer system 400 includes processor 410, memory 420, storage device 430, and input/output structure 440. One or more busses 450 typically interconnect the components, 410, 420, 430, and 440. Processor 410 may be a single or multi core.

Furthermore, while the system is shown as being a number of discrete elements above, those skilled in the art will readily appreciate that such structures may be integrated into a common device and as such be considered a "microcontroller" or a "microcomputer on a chip", or some other common designation.

Processor 410 executes instructions in which embodiments of the present disclosure may comprise steps described in one or more of the Figures. Such instructions may be stored in memory 420 or storage device 430. Data and/or information may be received and output using one or more input/output devices, and in particular output to the staggered power-up circuitry and systems that are the subject of the present disclosure.

Memory 420 may store data and may be a computer-readable medium, such as volatile or non-volatile memory. Storage device 430 may provide storage for system 400 including for example, the previously described methods. In various aspects, storage device 430 may be a flash memory device, a disk drive, an optical disk device, or a tape device employing magnetic, optical, or other recording technologies.

Input/output structures 440 may provide input/output operations for system 400.

Those skilled in the art will recognize that our description provided herein is merely exemplary and additional variations to our teachings are possible and contemplated. Accordingly, the scope of the disclosure should only be limited by the claims appended hereto.

The invention claimed is:

1. A computer implemented method for generating soft bit metrics in a telecommunications system employing modulation with differential encoding comprising the steps of:
   a) identifying, from the signs of received coordinates, a subset of coordinates that significantly contribute to a logarithmic likelihood ratio (LLR) of each bit;
   b) determining dominant terms of the LLR; and
   c) outputting an indicia of the soft bit metrics;
   wherein the subsets so identified are represented by (x1, x2), (y1, y2), (x1,y2), and (x2,Y1), with the coordinates x1, x2, y1 and y2 corresponding to in-phase and quadrature components of two successively received symbols produced by a modulator performing the differential encoding;
   wherein the identification step includes comparing coordinate magnitudes within a subset to generate a magnitude of the LLR.

2. The computer implemented method of claim 1 wherein the LLR for a bit includes a correction factor that depends on a coordinate that was determined to contribute significantly to the LLR of another bit.

3. The computer implemented method of claim 2 wherein the LLR for a bit exhibits a sign that is different from that obtained by a hard decision decoding.

4. The computer implemented method of claim 3 wherein the hard decision decoding output is used to change the sign of the LLR.

5. The computer implemented method of claim 4 wherein said soft bit metrics pertain to differentially encoded optical signals.

6. The computer implemented method of claim 5 wherein said soft bit metrics pertain to turbo codes, turbo product codes and convolutional codes.

7. The computer implemented method of claim 1 wherein said differentially encoding is one selected from the group consisting of QPSK, 16 QAM, and 64 QAM.

8. The computer implemented method of claim 1 wherein the dominant terms of the LLR are determined according to the following relationships:

$$llr(b_1) = \log\left(\frac{P(\alpha,\beta|C_1,C_2)+P(\alpha,\gamma|C_1,C_2)+P(\beta,\gamma|C_1,C_2)+P(\beta,\delta|C_1,C_2)}{P(\alpha,\delta|C_1,C_2)+P(\alpha,\alpha|C_1,C_2)+P(\beta,\alpha|C_1,C_2)+P(\beta,\beta|C_1,C_2)}\right.$$
$$\left.\cdots \frac{P(\gamma,\delta|C_1,C_2)+P(\gamma,\alpha|C_1,C_2)+P(\delta,\alpha|C_1,C_2)+P(\delta,\beta|C_1,C_2)}{P(\gamma,\beta|C_1,C_2)+P(\gamma,\gamma|C_1,C_2)+P(\delta,\gamma|C_1,C_2)+P(\delta,\delta|C_1,C_2)}\right);$$

wherein LLR is of bit $b_i$, and $P(\mu,v|C_1 C_2)$ represents the a posteriori probability of transitioning from transmitted symbol in set $\mu$ to a transmitted symbol in set $v$ given channel outputs $C_1$ and $C_2$; and $$|p^{-k}{}_1|+|p^{-k}{}_2|<\min(|p^k{}_1|,|p^k{}_2|)$$

wherein $C_1$ and $C_2$ and $p^k{}_1, p^k{}_2$ are defined in the following table:

| | Conditions | $p^1{}_1$ and $p^1{}_2$, | $p^2{}_1$ and $p^2{}_2$, |
|---|---|---|---|
| $C_1$ and $C_2$ are in adjacent quadrants | $C_1$ is in the 1st or 3rd quadrant | $x_1, x_2$ | $y_1, y_2$ |
| | $C_1$ is in the 2nd or 4th quadrant | $y_1, y_2$ | $x_1, x_2$ |
| $C_1$ and $C_2$ are not in adjacent quadrants | $C_1$ is in the 1st or 3rd quadrant | $y_1, x_2$ | $x_1, y_2$ |
| | $C_1$ is in the 2nd or 4th quadrant | $x_1, y_2$ | $y_1, x_2$. |

* * * * *